United States Patent
Wei et al.

(10) Patent No.: US 7,683,554 B2
(45) Date of Patent: Mar. 23, 2010

(54) HIGH-VOLTAGE LAMP-IGNITION PIEZOELECTRIC OSCILLATOR

(75) Inventors: Tao-Chin Wei, Taipei (TW); Ming Shing Chou, Taoyuan (TW); Hsi Chen Chang, Tucheng (TW)

(73) Assignees: Midas Wei Trading Co., Ltd., Taipei (TW); Champion Elite Company Limited, Tortola (VG)

( * ) Notice: Subject to any disclaimer, the term of this patent is extended or adjusted under 35 U.S.C. 154(b) by 96 days.

(21) Appl. No.: 12/025,852

(22) Filed: Feb. 5, 2008

(65) Prior Publication Data

US 2009/0174335 A1    Jul. 9, 2009

(30) Foreign Application Priority Data

Jan. 7, 2008    (TW) ............................... 97100566 A

(51) Int. Cl.
*H05B 41/00* (2006.01)
(52) U.S. Cl. ........... 315/209 PZ; 310/317; 310/316.01; 315/209 R; 315/224
(58) Field of Classification Search ........... 315/209 PZ, 315/200 R, 209 R, 224, 248, 276, 307, 55, 315/DIG. 4, DIG. 7; 239/102.2; 310/312, 310/313 B, 313 R, 316.01, 316.02, 315, 311, 310/317, 318, 319, 320, 321, 323.02, 328, 310/331, 339, 340, 348, 365; 331/109, 116 FE, 331/116 R, 117 R, 158, 176; 333/195, 187; 431/153, 255
See application file for complete search history.

(56) References Cited

U.S. PATENT DOCUMENTS 6,443,547 B1 *  9/2002 Takahashi et al. ............... 347/9
2004/0195936 A1 * 10/2004 Chemisky et al. ........... 310/317

* cited by examiner

*Primary Examiner*—Douglas W Owens
*Assistant Examiner*—Jae K Kim
(74) *Attorney, Agent, or Firm*—Ming Chow; Sinorica, LLC

(57) ABSTRACT

The present invention discloses a high-voltage lamp-ignition piezoelectric oscillator, wherein a piezoelectric capacitor is connected to an LC resonance circuit in parallel to transform power. The LC resonance circuit is used to generate resonance. Voltage is applied to the piezoelectric capacitor to deform the piezoelectric material due to the inverse-piezoelectric effect and then generate electricity after deformation due to the piezoelectric effect. The combination of piezoelectric and inverse-piezoelectric effects generates additional charge and boosts the voltage. Thereby, the present invention decreases power consumption and reduces cost.

6 Claims, 3 Drawing Sheets

HIGH-VOLTAGE LAMP-IGNITION PIEZOELECTRIC OSCILLATOR

BACKGROUND OF THE INVENTION

1. Field of the Invention

The present invention relates to a high-voltage lamp-ignition technology, particularly to a high-voltage lamp-ignition piezoelectric oscillator.

2. Description of the Related Art

The principle of CCFL (Cold Cathode Fluorescent Lamp) is similar to that of the daylight lamp. When a high voltage is input to the electrodes, few electrons impact the electrode at high speed to generate secondary electrons. Then, discharge begins, and electrons collide with mercury atoms, and the mercury atoms radiate ultraviolet ray with a wavelength of 253.7 nm. Then, the ultraviolet ray excites the fluorescent powder on the inner tube wall to emit visible light with the correlated color temperature. In addition to be used in display devices, PDA, digital cameras, mobile phones, etc., CCFL is also an indispensable element for backlight modules. CCFL does not use a lamp filament and thus is free from the problem of filament burnout; therefore, CCFL has a reliable lifetime. CCFL has the advantages of a small tube diameter, high light efficiency, high brightness, low temperature and a long service life when it is used as a light source.

To achieve a small size and a superior electric performance, the coil-type step-up transformer is replaced by a piezoelectric transformer in the ignition circuit of CCFL. As the piezoelectric transformer has a small size, high voltage gain, high efficiency, and superior insulation and is free of electromagnetic interference, it is usually used in the ignition circuit of a high light efficiency illumination system to achieve the characteristics of slimness, lightweight and superior electric performance.

In addition to increasing the size, increasing the area of the silver electrode is also a simple way to increase the output power of a piezoelectric transformer. However, increasing the area of the silver electrode will decrease the step-up ratio, which will affect the effect of increasing output power. Besides, increasing the size of a piezoelectric transformer also conflicts with the requirement of slimness and lightweight.

SUMMARY OF THE INVENTION

The primary objective of the present invention is to provide a high-voltage lamp-ignition piezoelectric oscillator, wherein a simple-structure piezoelectric capacitor cooperates with an LC resonance circuit to output a greater power, and whereby cost and power consumption is decreased, and competitiveness is increased.

Another objective of the present invention is to provide a high-voltage lamp-ignition piezoelectric oscillator, wherein the piezoelectric effect of a piezoelectric capacitor under an LC resonance circuit triggers an automatic protection mechanism to prevent from malfunction and overheating in an overload state.

To achieve the abovementioned objectives, the present invention proposes a high-voltage lamp-ignition piezoelectric oscillator, wherein a high-power piezoelectric plate is used as a piezoelectric capacitor in the high-voltage lamp-ignition ballast and inverter. When voltage is applied to the piezoelectric capacitor, the piezoelectric plate deforms due to the inverse-piezoelectric effect and then this deformation generates electricity due to the piezoelectric effect. The present invention can improve the conventional piezoelectric transformer, which can only output a small current and a limited power although it can provide a higher voltage.

In the present invention, the piezoelectric capacitor cooperates with an LC resonance circuit. When the LC resonance circuit resonates, the system has the best output performance. When the system is overloaded, the temperature of the piezoelectric capacitor will rise, and the capacitance increases. Thus, the LC resonance circuit can no more resonate, and the output decreases. Thereby, the present invention has an automatic protection function.

In addition to the LC resonance circuit, the piezoelectric capacitor may also cooperate with an auxiliary capacitor having a capacitance equivalent to that of the piezoelectric capacitor. When the LC resonance circuit resonates, the auxiliary capacitor can promote the piezoelectric effect and optimize the output power.

Below, the embodiments are described in detail in cooperation with the drawings to make easily understood the objectives, characteristics and efficacies of the present invention.

DETAILED DESCRIPTION OF THE INVENTION

Figure 1:
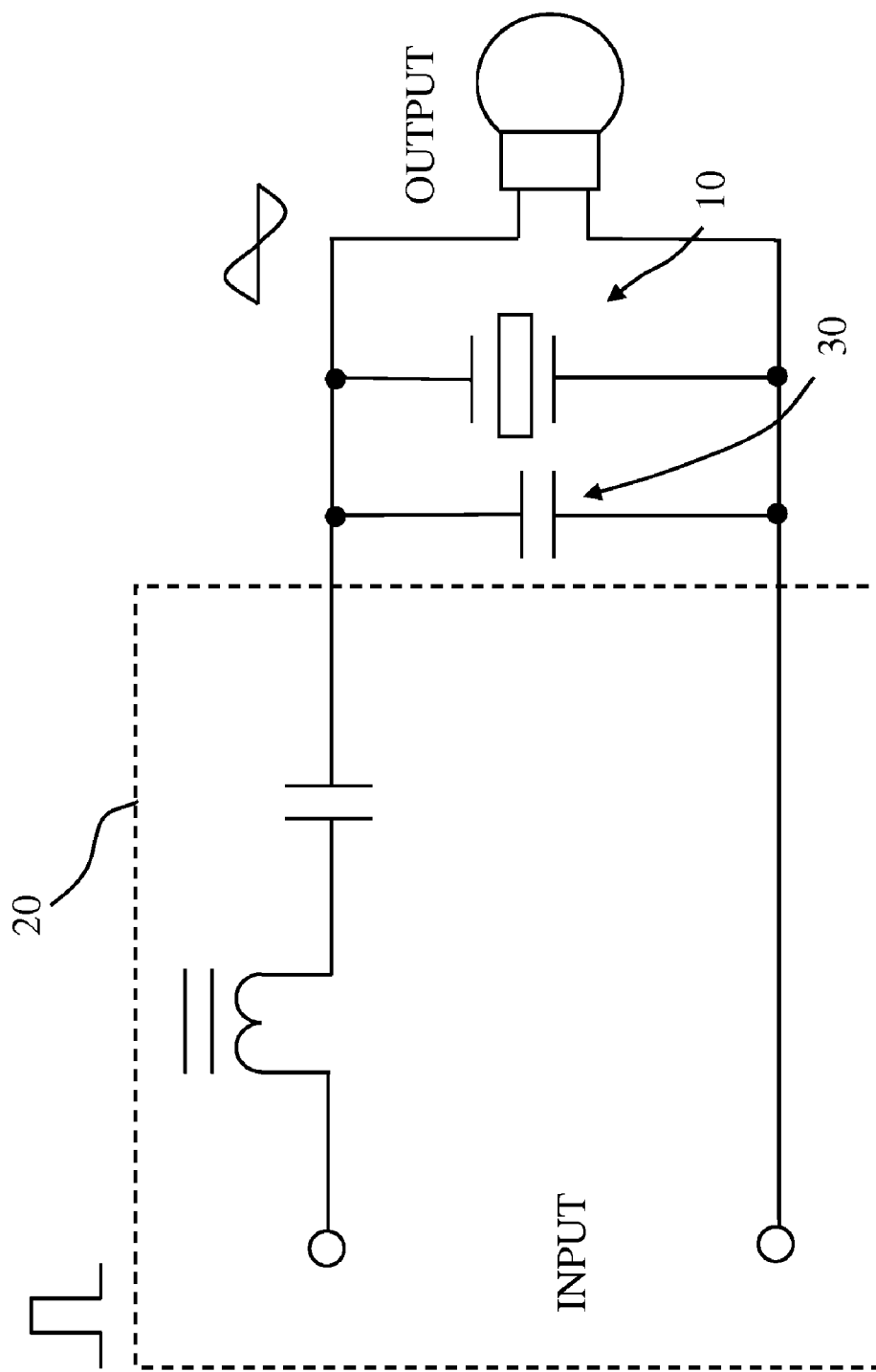
FIG. 1 is a diagram schematically showing a high-voltage lamp-ignition piezoelectric oscillator according to one embodiment of the present invention.

Refer to FIG. 1 a diagram schematically showing a high-voltage lamp-ignition piezoelectric oscillator according to one embodiment of the present invention. The high-voltage lamp-ignition piezoelectric oscillator of the present invention comprises: a capacitor 10, an LC resonance circuit 20 and an auxiliary capacitor 30, and all of them are connected in parallel. The capacitor 10 is a piezoelectric capacitor, which has piezoelectricity and is used to store electric energy, regulate the power factor and output power. When voltage is applied to the piezoelectric capacitor 10, the piezoelectric material deforms due to the inverse-piezoelectric effect and then this deformation generates the electricity by the piezoelectric effect. The combination of piezoelectric and inverse-piezoelectric effects generates additional charge, boosts voltage and outputs a greater power. In the present invention, the piezoelectric capacitor 10 cooperates with the LC resonance circuit 20, which can create resonance. When the LC resonance circuit 20 resonates, the piezoelectric oscillator has the best output performance.

As the capacitance of the piezoelectric capacitor 10 correlates with temperature, the output voltage of the piezoelectric capacitor 10 varies under a constant current. In this embodiment, the auxiliary capacitor 30 is adopted to cooperate with the piezoelectric capacitor 10. The auxiliary capacitor 30 has a capacitance equal to that of the piezoelectric capacitor 10 and is used to aid charging and optimize the output power. When the lamp is being ignited, the voltage will rise instantly. After lamp ignition is completed, the capacitance is regulated appropriately. Thus, the output will be modified with the piezoelectric effect to reduce extra power consumption.

Figure 2:
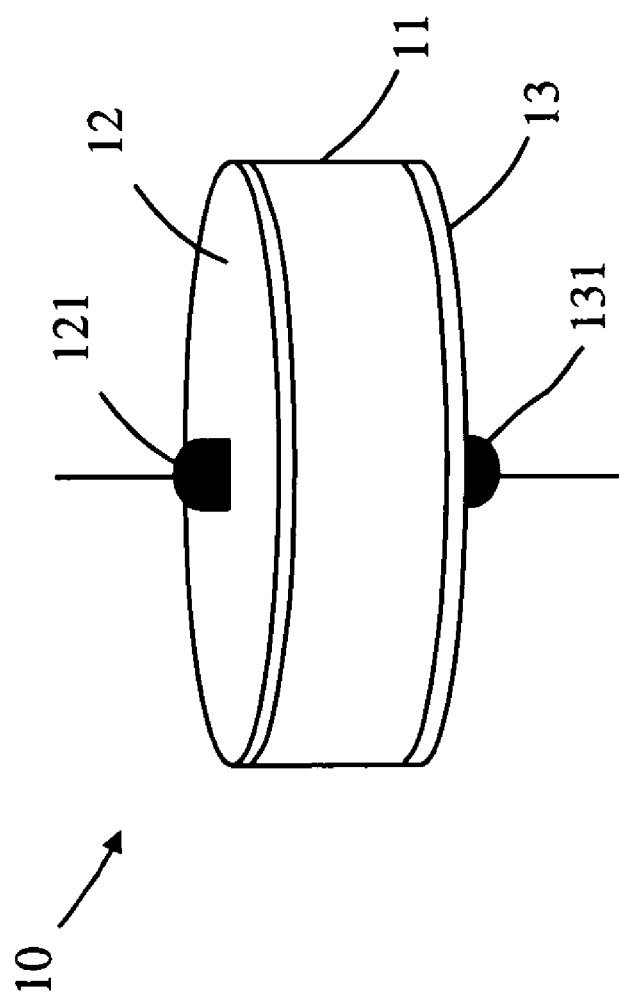
FIG. 2 is a diagram schematically showing a piezoelectric capacitor according to one embodiment of the present invention.

Refer to FIG. 2. In this embodiment, a piezoelectric material is fabricated into a circular piezoelectric plate 11. Silver paste, copper paste or nickel paste is also fabricated into circular conductive layers 12 and 13. The circular conductive layers 12 and 13 are respectively formed on the top and bottom surfaces of the circular piezoelectric plate 11 and partially or entirely cover the top and bottom surfaces of the circular piezoelectric plate 11 to function as two electrodes of the piezoelectric capacitor 10. Electrode leads 121 and 131 are respectively formed on the external sides of the conductive layers 12 and 13 and are connected with the LC resonance circuit 20. This embodiment of the present invention adopts only one piece of piezoelectric capacitor 10, which can output a power as high as 70 W and can collocate with a mere half-bridge resonance circuit. Thus, the present invention can reduce the fabrication cost and has superior price competitiveness. Naturally, if the piezoelectric capacitor 10 cooperates with a full-bridge resonance circuit, it can output a further greater power. Besides, if the piezoelectric capacitor 10 cooperates with an L-impedance LC resonance circuit, it has an automatic protection function. When the piezoelectric capacitor 10 is overloaded, the capacitance increases, and the resonance output is changed to reduce the output power and decrease the temperature The piezoelectric capacitor 10 has piezoelectricity; once the piezoelectric capacitor 10 is overloaded, the temperature rises, and the capacitance increases. Thus, the capacitance of the LC resonance circuit 20 is varied, and the LC resonance circuit 20 stops resonating. Then, the output decreases, and the lamp dims. Thereby, the present invention can prevent from malfunction and overheating.

Figure 3:
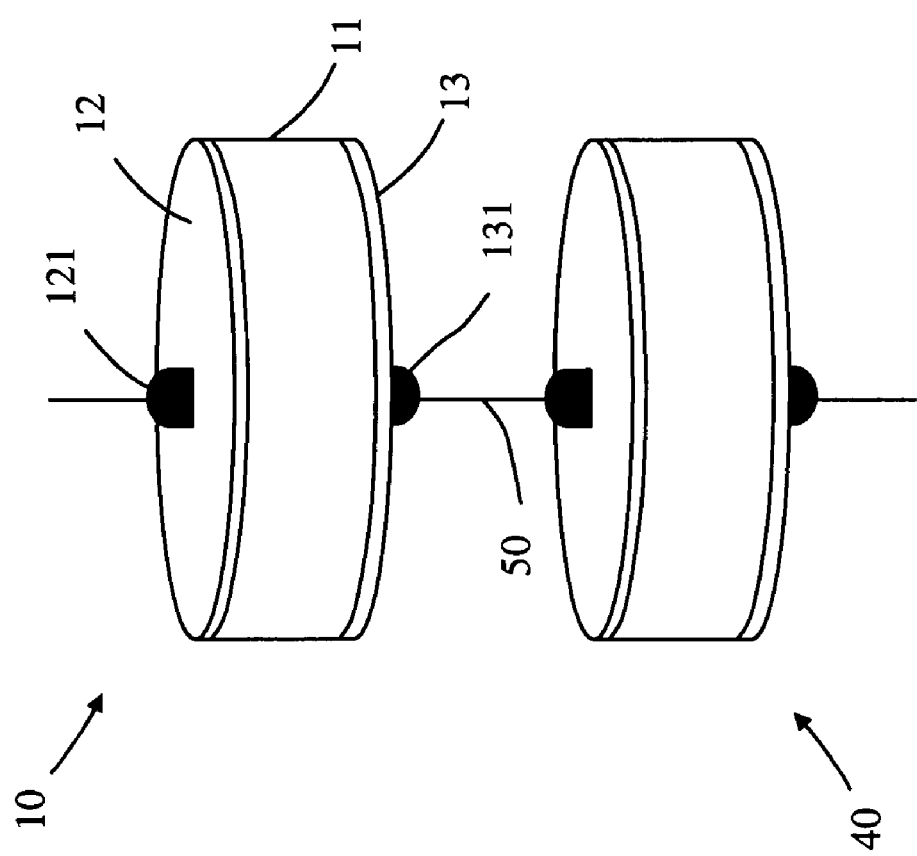
FIG. 3 is a diagram schematically showing a piezoelectric capacitor according to another embodiment of the present invention.

Refer to FIG. 3 for another embodiment of the present invention. In practical application, the piezoelectric capacitors can be connected in series or in parallel. In this embodiment, two piezoelectric capacitors 10 and 40 are connected via a wire 50, wherein the piezoelectric capacitor 10 has a circular piezoelectric plate 11 and two conductive layers 12 and 13. The piezoelectric capacitors 10 and 40 have an identical structure; therefore, they are exemplified with the piezoelectric capacitor 10. In this embodiment, as the capacitance and inductance increases, the power generated by the resonance also increases. Thus, the output power can reach a level as high as 100 W with the temperature maintained about 30° C. Therefore, the piezoelectric capacitor of this embodiment can provide an output power double that of the conventional piezoelectric capacitor without overheating.

The embodiments described above are only to exemplify the present invention but not to limit the scope of the present invention. Any equivalent modification or variation according to the spirit of the present invention is to be also included with the scope of the present invention, which is based on the claims stated below.

What is claimed is:

1. A high-voltage lamp-ignition piezoelectric oscillator, which comprises a capacitor and an LC resonance circuit, characterized in
    that said oscillator is used to receive a square electrical signal and convert it into a sinusoidal wave electrical signal for output as required and said capacitor is a piezoelectric capacitor connected to said LC resonance circuit in parallel, and
    said piezoelectric capacitor comprises:
        a circular piezoelectric plate made of a piezoelectric material and having a top surface and a bottom surface; and
        two conductive layers respectively formed on said top surface and said bottom surface of said circular piezoelectric plate to function as two electrodes of said piezoelectric capacitor.

2. The high-voltage lamp-ignition piezoelectric oscillator of claim 1 further comprising an auxiliary capacitor connected in parallel to between said piezoelectric capacitor and said LC resonance circuit.

3. The high-voltage lamp-ignition piezoelectric oscillator of claim 2, wherein said auxiliary capacitor has a capacitance equivalent to that of said piezoelectric capacitor at room temperature.

4. The high-voltage lamp-ignition piezoelectric oscillator of claim 1, wherein two electrode leads are respectively soldered onto said two conductive layers and connected to said LC resonance circuit.

5. The high-voltage lamp-ignition piezoelectric oscillator of claim 1, wherein said two conductive layers are circular, and said two conductive layers respectively partially or entirely cover said top surface and said bottom surface of said circular piezoelectric plate.

6. The high-voltage lamp-ignition piezoelectric oscillator of claim 1, wherein said two conductive layers are made of silver paste, copper paste or nickel paste.

* * * * *